(12) United States Patent
Wang et al.

(10) Patent No.: US 12,274,124 B2
(45) Date of Patent: Apr. 8, 2025

(54) DISPLAY ASSEMBLY AND VIRTUAL REALITY DISPLAY DEVICE

(71) Applicant: BOE TECHNOLOGY GROUP CO., LTD., Beijing (CN)

(72) Inventors: Can Wang, Beijing (CN); Can Zhang, Beijing (CN); Han Yue, Beijing (CN); Ming Yang, Beijing (CN); Ning Cong, Beijing (CN); Jiao Zhao, Beijing (CN); Minghua Xuan, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 812 days.

(21) Appl. No.: 16/973,005

(22) PCT Filed: Mar. 18, 2020

(86) PCT No.: PCT/CN2020/079844
§ 371 (c)(1),
(2) Date: Dec. 7, 2020

(87) PCT Pub. No.: WO2020/192509
PCT Pub. Date: Oct. 1, 2020

(65) Prior Publication Data
US 2021/0249634 A1  Aug. 12, 2021

(30) Foreign Application Priority Data
Mar. 28, 2019  (CN) .......................... 201910243939.3

(51) Int. Cl.
*H01L 51/52* (2006.01)
*H10K 50/844* (2023.01)
(Continued)

(52) U.S. Cl.
CPC ......... *H10K 50/858* (2023.02); *H10K 50/844* (2023.02); *H10K 59/38* (2023.02)

(58) Field of Classification Search
CPC ...... H10K 59/38; H10K 59/879; H10K 59/10; H10K 59/17; H10K 59/12; H10K 59/124;
(Continued)

(56) References Cited

U.S. PATENT DOCUMENTS

2012/0199859 A1  8/2012  Shikina et al.
2012/0217521 A1*  8/2012  Ohta ...................... H10K 50/86
257/89
(Continued)

FOREIGN PATENT DOCUMENTS

CN  102629622 A  8/2012
CN  104678641 A  6/2015
(Continued)

OTHER PUBLICATIONS

ISA China National Intellectual Property Administration, International Search Report and Written Opinion Issued in Application No. PCT/CN2020/079844, Jun. 18, 2020, 15 pages.
(Continued)

*Primary Examiner* — Lawrence C Tynes, Jr.
(74) *Attorney, Agent, or Firm* — McCoy Russell LLP

(57) ABSTRACT

The present disclosure provides a display assembly and a virtual reality display device. The display assembly includes an electroluminescent element, a packaging layer and a light converging layer arranged sequentially. The light converging layer is configured to converge light emitted by the electroluminescent element and transmitted through the packaging layer. The electroluminescent element includes a plurality of pixels, the light converging layer is tightly attached to the packaging layer, and an orthogonal projection of each pixels onto a surface of the packaging layer to which the light converging layer is tightly attached is completely covered by the light converging layer.

6 Claims, 2 Drawing Sheets

(51) Int. Cl.
   *H10K 50/858*   (2023.01)
   *H10K 59/38*   (2023.01)
(58) Field of Classification Search
   CPC ............ H10K 59/8723; H10K 59/127; H10K 50/858; H10K 50/182; H10K 50/8428; H10K 2102/302; H10K 2102/321; H10K 39/34; H10K 65/00; H01L 31/0543; H01L 2924/12044; H04N 25/11; H04N 2201/3245; H03K 2017/9634; H03K 2217/960795; H03K 221/9656; H05B 45/60; H04M 2203/359; H04L 67/131; G02B 27/0172; G02B 227/0174
   See application file for complete search history.

(56) References Cited

U.S. PATENT DOCUMENTS

| | | | |
|---|---|---|---|
| 2012/0218173 A1* | 8/2012 | Ohta | ............. H10K 50/858 345/76 |
| 2014/0339509 A1 | 11/2014 | Choi et al. | |
| 2018/0180888 A1 | 6/2018 | Jung et al. | |

FOREIGN PATENT DOCUMENTS

| | | |
|---|---|---|
| CN | 106019599 A | 10/2016 |
| CN | 106129260 A | 11/2016 |
| CN | 108919493 A | 11/2018 |
| CN | 106129260 B | 3/2019 |
| CN | 109841757 A | 6/2019 |
| JP | 2004039500 A | 2/2004 |

OTHER PUBLICATIONS

State Intellectual Property Office of the People's Republic of China, Office Action and Search Report Issued in Application No. 201910243939.3, Oct. 9, 2020, 14 pages. (Submitted with Partial Translation).

European Patent Office, Extended European Search Report Issued in Application No. 20778514.8, Nov. 21, 2022, Germany, 10 pages.

* cited by examiner

DISPLAY ASSEMBLY AND VIRTUAL REALITY DISPLAY DEVICE

The present application is a U.S. National Phase of International Patent Application No. PCT/CN2020/079844, entitled "DISPLAY ASSEMBLY AND VIRTUAL REALITY DISPLAY APPARATUS," and filed on Mar. 18, 2020. International Patent Application No. PCT/CN2020/079844 claims priority to Chinese Patent Application No. 201910243939.3 filed on Mar. 28, 2019. The entire contents of the above-listed applications are hereby incorporated by reference for all purposes.

TECHNICAL FIELD

The present disclosure relates to the field of display technology, specifically to the field of silicon-based Organic Light-Emitting Diode (OLED), in particular to a display assembly and a virtual reality display device.

BACKGROUND AND SUMMARY

Recently, Augmented Reality (AR) has developed rapidly, and a high-end product is treated using an optical waveguide technique to acquire a thinner and lighter product. However, a relatively large optical loss occurs for an optical waveguide, so it is necessary to provide an element with relatively large brightness. A silicon-based OLED has such advantages as self-luminescence and being light and thin, so it is able to meet the requirement on portable of an AR product. However, the silicon-based OLED has relatively small brightness, and it is impossible to meet the requirement on high brightness of the AR product. There is an urgent need to increase the brightness of the silicon-based OLED, so as to apply it in an AR field.

An object of the present disclosure is to provide a display assembly and a virtual reality display device, so as to increase brightness of a silicon-based OLED.

In one aspect, the present disclosure provides in some embodiments a display assembly, including an electroluminescent element, a packaging layer and a light converging layer arranged sequentially. The light converging layer is configured to converge light emitted by the electroluminescent element and transmitted through the packaging layer. The electroluminescent element includes a plurality of pixels, the light converging layer is tightly attached to the packaging layer, and an orthogonal projection of each pixel onto a surface of the packaging layer to which the light converging layer is tightly attached is completely covered by the light converging layer.

In a possible embodiment of the present disclosure, the light converging layer includes a plurality of lenses in one-to one correspondence with the pixels, and the orthogonal project of each pixel onto the surface of the packaging layer to which the light converging layer is tightly attached at least partially overlap an orthogonal projection of a corresponding lens onto the surface of the packaging layer to which the light converging layer is tightly attached.

In a possible embodiment of the present disclosure, a distance between a center of any pixel and a main optical axis of the lens corresponding to the pixel is smaller than or equal to 0.5 µm.

In a possible embodiment of the present disclosure, a focal length of the lens is greater than or equal to 1.7 times of an aperture of the lens.

In a possible embodiment of the present disclosure, a first protection layer, a color filter substrate and a second protection layer are sequentially arranged on the packaging layer in a direction from the electroluminescent element to the light converging layer. The display assembly further includes a third protection layer arranged at a side of the second protection layer away from the electroluminescent element, and the plurality of lenses are arranged between the third protection layer and the second protection layer.

In a possible embodiment of the present disclosure, a refractive index of the third protection layer, a refractive index of each lens and a refractive index of the second protection layer meet the following formulae:

$$\frac{n_2 - n_3}{n_1} = \frac{r}{f} \text{ and } \frac{n_2 - n_3}{n_1} \geq \frac{D}{2f},$$

where $n_1$ represents the refractive index of the second protection layer, $n_2$ represents the refractive index of each lens, $n_3$ represents the refractive index of the third protection layer, r represents a radius of curvature of each lens, f represents a focal length of each lens, and D represents an aperture of each lens.

In a possible embodiment of the present disclosure, the color filter substrate is provided with a plurality of color units in one-to one correspondence with the pixels, an orthogonal projection of each color unit onto the surface of the packaging layer to which the light converging layer is tightly attached, an orthogonal projection of a corresponding pixel onto the surface of the packaging layer to which the light converging layer is tightly attached, and the orthogonal projection of the lens corresponding to the pixel at least partially overlap each other. For the color unit and the lens corresponding to the same pixel, light emitted from any point at a surface of the pixel facing the packaging layer passes through any point at a surface of the color unit facing the lens and passes through a surface of the lens tightly attached to the packaging layer.

In a possible embodiment of the present disclosure, the main optical axis of each lens beyond a center of the light converging layer is biased toward a central line of the light converging layer.

In a possible embodiment of the present disclosure, a thickness of the packaging layer is greater than or equal to 0.8 times of a focal length of each lens, and smaller than or equal to 1.2 times of the focal length of each lens.

In another aspect, the present disclosure provides in some embodiments a virtual reality display device, including an optical waveguide assembly and the above-mentioned display assembly. Light emitted by the display assembly enters the optical waveguide assembly.

BRIEF DESCRIPTION OF THE FIGURES

Through reading the detailed description about non-restrictive embodiments given with reference to the following drawings, the other features, objects and advantages of the present disclosure will become more apparent.

DETAILED DESCRIPTION

Figure 1:
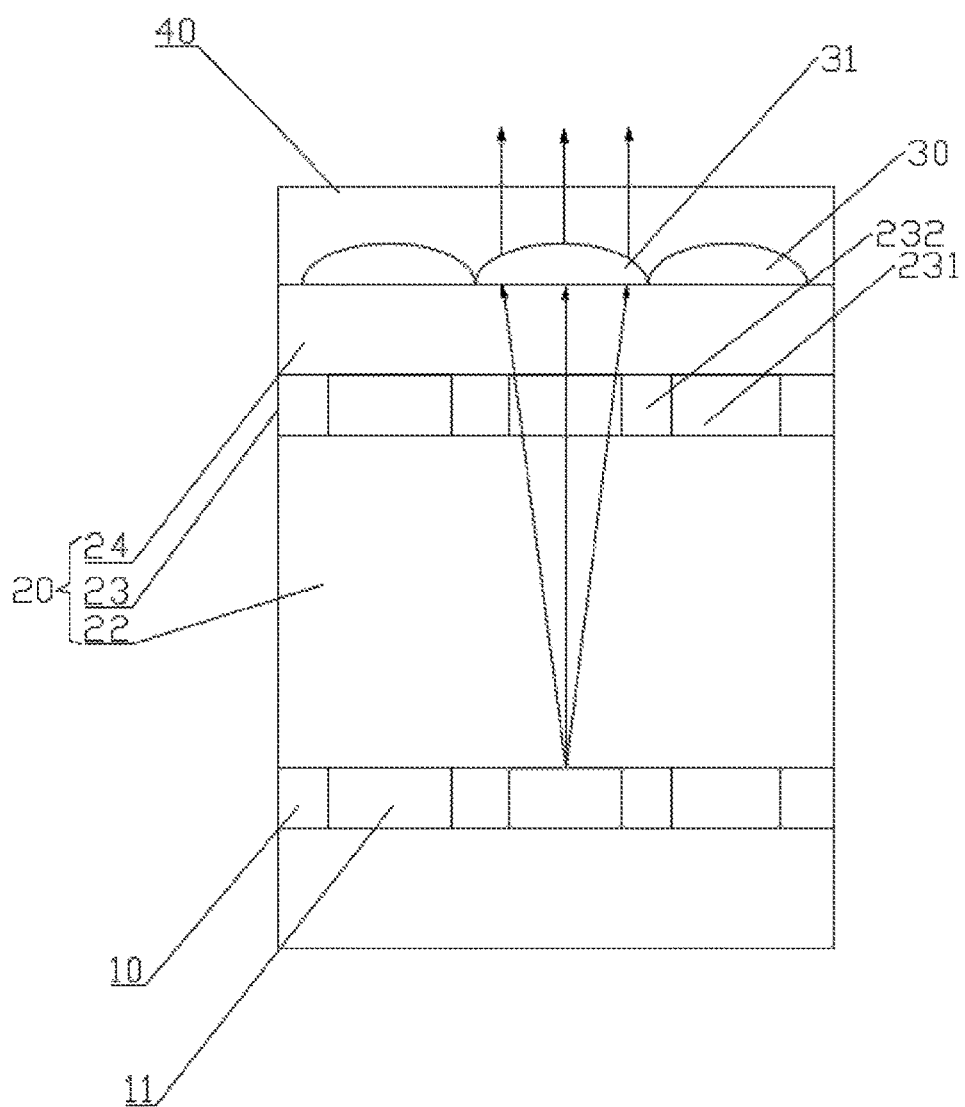
FIG. 1 is a schematic view showing a display assembly according to one embodiment of the present disclosure.

The present disclosure will be described hereinafter in details in conjunction with the drawings and embodiments.

It should be appreciated that, the embodiments are for illustrative purposes only, but shall not be construed as limiting the present disclosure. It should be further appreciated that, for ease of description, merely components associated with the present disclosure are shown in the drawings.

It should be appreciated that, in the case of no conflict, the embodiments and the features in the embodiments may be combined. The present disclosure will be described hereinafter in conjunction with the drawings and embodiments.

Considering the drawbacks in the related art, an object of the present disclosure is to provide a display assembly and a virtual reality display device, so as to increase brightness of a silicon-based OLED.

As shown in FIG. 1, the present disclosure provides in some embodiments a display assembly, including an electroluminescent element 10, a packaging layer 20 and a light converging layer 30 arranged sequentially. The light converging layer 30 is configured to converge light emitted by the electroluminescent element 10 and transmitted through the packaging layer 20. The electroluminescent element 10 includes a plurality of pixels 11, the light converging layer 30 is tightly attached to the packaging layer 20, and an orthogonal projection of each pixel 11 onto a surface of the packaging layer 20 to which the light converging layer 30 is tightly attached is completely covered by the light converging layer 30.

Figure 3:
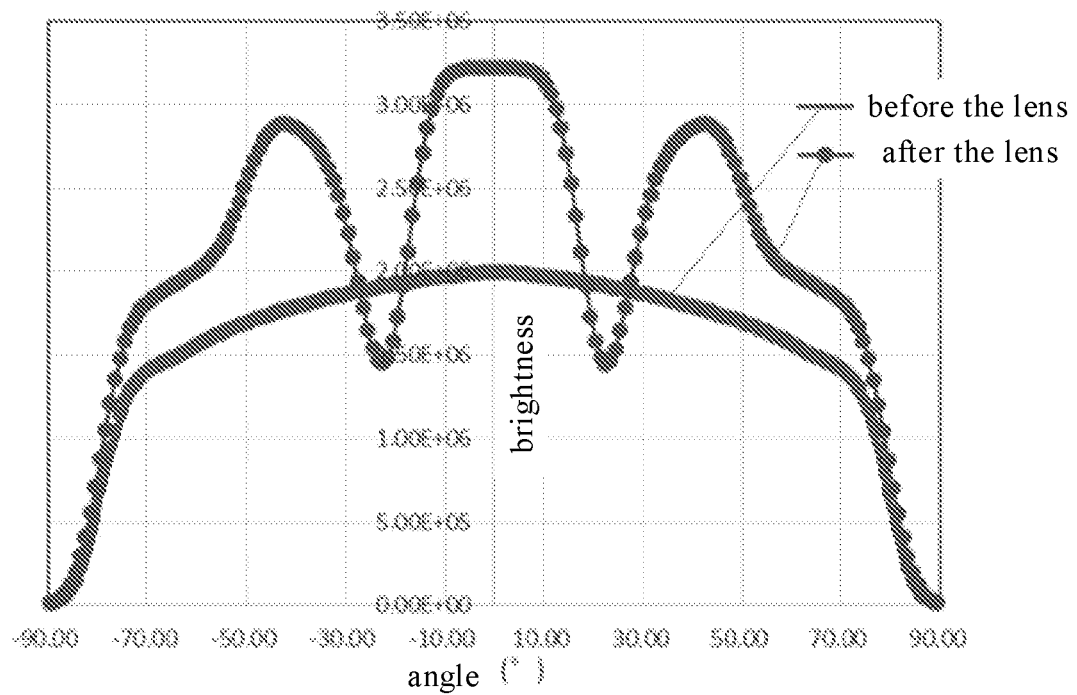
FIG. 3 is a curve diagram showing brightness of light before and after a lens of the display assembly according to one embodiment of the present disclosure.

In the embodiments of the present disclosure, the electroluminescent element may be of a commonly-used structure, and packaged through the packaging layer, so as to prolong a service life of the electroluminescent element and improve the reliability of the display assembly. The light converging layer may be formed at a side of the packaging layer away from the electroluminescent element. The light may be emitted by the electroluminescent element and transmitted through the packaging layer toward the light converging layer. The light converging layer may converge the light, so as to increase brightness of the light exiting the light converging layer in an approximately central viewing angle of the light converging layer. The light converging layer may include lenses. As shown in FIG. 3, a curve without dots represents the brightness of the light from the display assembly without any light converging layer, and a curve with dots represents the brightness of the light from the display assembly with the light converging layer. The brightness of the light may be increased within ±9° of the central viewing angle of the light converging layer. For a virtual reality display device using an optical waveguide technique, an optical viewing angle is less demanded and it is also ±9°. Through increasing the brightness of the light from the electroluminescent element using the light converging layer, it is able to meet the requirement of the virtual reality display device using the optical waveguide technique on the optical viewing angle, and apply the silicon-based OLED to the virtual reality display device, thereby to provide a thinner, lighter and more portable display assembly.

The light may be emitted by the electroluminescent element and transmitted through the packaging layer toward the light converging layer. The light converging layer may converge the light, so as to increase the brightness of the light within a certain range, thereby to meet the requirement of the virtual reality display device on the brightness. A light-emission region may be formed at the packaging layer, and the light converging layer may cover the light-emission region, so as to converge the light as much as possible and improve a light converging effect of the light converging layer, thereby to ensure a display effect of the display assembly.

Further, the light converging layer 30 may include a plurality of lenses 31 in one-to one correspondence with the pixels 11, and the orthogonal project of each pixel 11 onto the surface of the packaging layer 20 to which the light converging layer 30 is tightly attached may at least partially overlap an orthogonal projection of a corresponding lens 31 onto the surface of the packaging layer 20 to which the light converging layer 30 is tightly attached.

In the embodiments of the present disclosure, the light converging layer may include the plurality of lenses. Each pixel is capable of emitting light, and the plurality of pixels may be in one-to one correspondence with the plurality of lenses. In other words, each lens is capable of converging the light emitted by the corresponding pixel, so as to increase the brightness of the light emitted by each pixel, thereby to enable the display assembly to meet the requirement of the virtual reality display device on the brightness.

Each lens may be made of, but not limited to, organic resin, and the light converging layer may be formed on the electroluminescent element through impressing, photoresist melting, printing, etc.

Further, a distance between a center of any pixel 11 and a main optical axis of the lens 31 corresponding to the pixel 11 may be smaller than or equal to 0.5 μm.

In the embodiments of the present disclosure, a size of the light-emission region of the packaging layer may be adjusted through controlling an aperture size of each pixel on the electroluminescent element, and the aperture size of the pixel and an aperture of each lens may be adjusted in accordance with the requirement on a resolution of the display assembly. The distance between the center of any pixel and the main optical axis of the lens corresponding to the pixel may be smaller than or equal to 0.5 μm. In a possible embodiment of the present disclosure, the center of any pixel may be located on the main optical axis of the lens corresponding to the pixel, so as to improve the light converging effect of the light converging layer, and ensure the display effect of the display assembly.

Further, a focal length of the lens 31 may be greater than or equal to 1.7 times of the aperture of the lens 31.

In the embodiments of the present disclosure, when the focal length of the lens is greater than or equal to 1.7 times of the aperture of the lens, it is able to reduce a processing difficulty of the lens, ensure the effect of light converging, increasing the brightness of the light of the lens, and facilitate the manufacture of the display assembly.

Further, a first protection layer 22, a color filter substrate 23 and a second protection layer 24 may be sequentially arranged on the packaging layer 20 in a direction from the electroluminescent element 10 to the light converging layer 30. The display assembly may further include a third protection layer 40 arranged at a side of the second protection layer 24 away from the electroluminescent element 10, and the plurality of lenses 31 may be arranged between the third protection layer 40 and the second protection layer 24.

In the embodiments of the present disclosure, the first protection layer 22 may be, but not limited to, a thin film packaging layer, the second protection layer 24 may be, but not limited to, a silicon oxide thin film layer, and the third protection layer 40 may be, but not limited to, a packaging layer or an adhesion layer. The light emitted by the electroluminescent element may pass through the color filter substrate to acquire light in three primary colors, and then the light in three primary colors may be combined to achieve colorful display through the display assembly.

Further, a refractive index of the third protection layer 40, a refractive index of each lens 31 and a refractive index of the second protection layer 24 may meet the following formulae:

$$\frac{n_2 - n_3}{n_1} = \frac{r}{f} \text{ and } \frac{n_2 - n_3}{n_1} \geq \frac{D}{2f},$$

where $n_1$ represents the refractive index of the second protection layer 24, $n_2$ represents the refractive index of each lens 31, $n_3$ represents the refractive index of the third protection layer 40, r represents a radius of curvature of each lens 31, f represents a focal length of each lens 31, and D represents an aperture of each lens 31.

In the embodiments of the present disclosure, through defining the refractive indices of the third protection layer, the lens and the second protection layer, it is able to ensure the light converging effect of the light converging layer as well as the display effect of the display assembly.

Further, the color filter substrate 23 may be provided with a plurality of color units 231 in one-to one correspondence with the pixels 11, an orthogonal projection of each color unit 231 onto the surface of the packaging layer 20 to which the light converging layer 30 is tightly attached, an orthogonal projection of a corresponding pixel 11 onto the surface of the packaging layer 20 to which the light converging layer 30 is tightly attached, and the orthogonal projection of the lens 31 corresponding to the pixel 11 may at least partially overlap each other.

For the color unit 231 and the lens 31 corresponding to the same pixel 11, the light emitted from any point at a surface of the pixel 11 facing the packaging layer 20 may pass through any point at a surface of the color unit 231 facing the lens 31 and pass through a surface of the lens 31 tightly attached to the packaging layer 20.

In the embodiments of the present disclosure, the color film substrate may further include black matrices 232. The color units 231 may be arranged in an array form, and the black matrices 232 and the color units 231 may be arranged alternately. Each lens 31 is capable of fully receiving the light emitted by the corresponding pixel and transmitted through the color unit 231, i.e., it is able for the lens to converge the light, so as to improve the light converging effect of the light converging layer, thereby to ensure the display effect of the display assembly.

Further, the main optical axis of each lens 31 beyond a center of the light converging layer 30 may be biased toward a central line of the light converging layer 30.

In the embodiments of the present disclosure, when the main optical axis of each lens beyond the center of the light converging layer is biased toward the central line of the light converging layer, it is able for the light passing through the light converging layer to be biased toward the central line of the light converging layer, thereby to improve the light converging effect of the light converging layer, increase the brightness of the light emitted by the display assembly, and ensure the display effect of the display assembly.

Further, a thickness of the packaging layer 20 may be greater than or equal to 0.8 times of the focal length of each lens 31, and smaller than or equal to 1.2 times of the focal length of each lens 31.

In the embodiments of the present disclosure, the thickness of the packaging layer 20 may be greater than or equal to 0.8 times of the focal length of each lens 31, and smaller than or equal to 1.2 times of the focal length of each lens 31. In a possible embodiment of the present disclosure, the thickness of the packaging layer may be equal to the focal length of each lens, so as to ensure the light converging effect of the light converging layer as well as the display effect of the display assembly.

Figure 2:
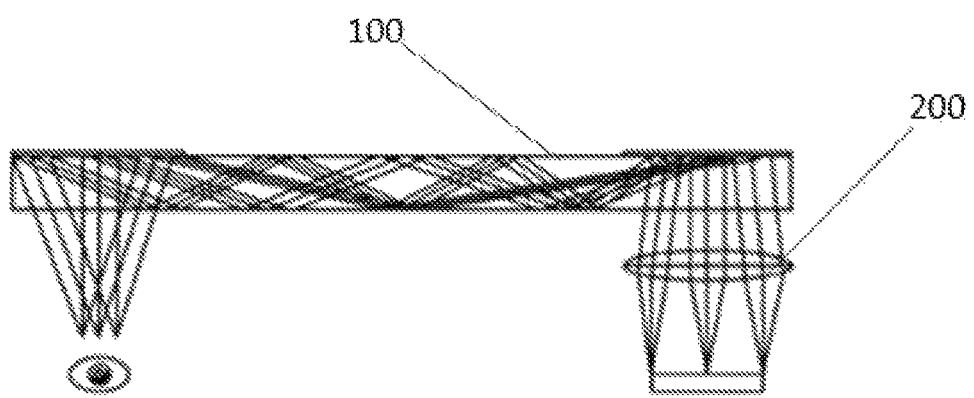
FIG. 2 is a schematic view showing a virtual reality display device according to one embodiment of the present disclosure.

The present disclosure further provides in some embodiments a virtual reality display device which, as shown in FIG. 2, includes an optical waveguide assembly 100 and a display assembly 200. Light emitted by the display assembly 200 may enter the optical waveguide assembly 100.

In the embodiments of the present disclosure, the electroluminescent element may be of a commonly-used structure, and packaged through the packaging layer, so as to prolong a service life of the electroluminescent element and improve the reliability of the display assembly. The light converging layer may be formed at a side of the packaging layer away from the electroluminescent element. The light may be emitted by the electroluminescent element and transmitted through the packaging layer toward the light converging layer. The light converging layer may converge the light, so as to increase brightness of the light exiting the light converging layer in an approximately central viewing angle of the light converging layer. The brightness of the light may be increased within ±9° of the central viewing angle of the light converging layer. For a virtual reality display device using an optical waveguide technique, an optical viewing angle is less demanded and it is also ±9°. Through increasing the brightness of the light from the electroluminescent element using the light converging layer, it is able to meet the requirement of the virtual reality display device using the optical waveguide technique on the optical viewing angle, and apply the silicon-based OLED to the virtual reality display device, thereby to provide a thinner, lighter and more portable display assembly.

The light may be emitted by the electroluminescent element and transmitted through the packaging layer toward the light converging layer. The light converging layer may converge the light, so as to increase the brightness of the light within a certain range, thereby to meet the requirement of the virtual reality display device on the brightness. A light-emission region may be formed at the packaging layer, and the light converging layer may cover the light-emission region, so as to converge the light as much as possible and improve a light converging effect of the light converging layer, thereby to ensure a display effect of the display assembly.

The light emitted by the display assembly may enter, and pass through, the optical waveguide assembly toward a human eye, so as to display a pattern.

According to the embodiments of the present disclosure, the light converging layer may be tightly attached to the packaging layer and converge the light emitted by the electroluminescent element. As a result, it is able to increase the brightness of the light exiting the light converging layer, thereby to meet the requirement of an AR product on large brightness, and solve the problem in the related art where it is impossible to meet the requirement of the AR product on the large brightness due to low brightness of the silicon-based OLED.

The above descriptions are merely preferred embodiments of the present disclosure and explanations of the applied technical principles. It should be appreciated for a person skilled in the art that, the scope of the present disclosure is not limited to technical solutions formed by the specific combination of the above technical features, and should also cover other technical solutions formed by any combination of the above technical features or equivalent features thereof without departing from the inventive concept, such as a technical solution formed by that the above features and the technical features provided (but not limited to) in the present disclosure with similar functions are mutually replaced.

The invention claimed is:

1. A virtual reality display device, comprising an optical waveguide assembly and a display assembly, wherein the display assembly comprises an electroluminescent element, a packaging layer and a light converging layer arranged sequentially, wherein the light converging layer is configured to converge light emitted by the electroluminescent element and transmitted through the packaging layer, the electroluminescent element comprises a plurality of pixels, the light converging layer is tightly attached to the packaging layer, and an orthogonal projection of each pixel onto a surface of the packaging layer to which the light converging layer is tightly attached is completely covered by the light converging layer;

the light converging layer comprises a plurality of lenses in one-to one correspondence with the pixels, and wherein a first protection layer, a color filter substrate and a second protection layer are sequentially arranged on the packaging layer in a direction from the electroluminescent element to the light converging layer, wherein the display assembly further comprises a third protection layer, and the plurality of lenses is arranged between the third protection layer and the second protection layer; the first protection layer is a thin film packaging layer, and a thickness of the first protection layer is greater than a thickness of the second protection layer in a direction from the lens to the corresponding pixel; wherein light emitted by the display assembly enters the optical waveguide assembly.

2. The virtual reality display device according to claim 1, wherein a distance between a center of any pixel and a main optical axis of the lens corresponding to the pixel is smaller than or equal to 0.5 μm.

3. The virtual reality display device according to claim 1, wherein a focal length of the lens is greater than or equal to 1.7 times of an aperture of the lens.

4. The virtual reality display device according to claim 1, wherein a refractive index of the third protection layer, a refractive index of each lens and a refractive index of the second protection layer meet the following formulae:

$$\frac{n_2 - n_3}{n_1} = \frac{r}{f} \text{ and } \frac{n_2 - n_3}{n_1} \geq \frac{D}{2f},$$

where $n_1$ represents the refractive index of the second protection layer, $n_2$ represents the refractive index of each lens, $n_3$ represents the refractive index of the third protection layer, r represents a radius of curvature of each lens, f represents a focal length of each lens, and D represents an aperture of each lens.

5. The virtual reality display device according to claim 1, wherein the color filter substrate is provided with a plurality of color units in one-to one correspondence with the pixels, an orthogonal projection of each color unit onto the surface of the packaging layer to which the light converging layer is tightly attached, an orthogonal projection of a corresponding pixel onto the surface of the packaging layer to which the light converging layer is tightly attached, and the orthogonal projection of the lens corresponding to the pixel at least partially overlap each other, wherein for the color unit and the lens corresponding to the same pixel, light emitted from any point at a surface of the pixel facing the packaging layer passes through any point at a surface of the color unit facing the lens and passes through a surface of the lens tightly attached to the packaging layer.

6. The virtual reality display device according to claim 1, wherein a thickness of the packaging layer is greater than or equal to 0.8 times of a focal length of each lens, and smaller than or equal to 1.2 times of the focal length of each lens.

* * * * *